United States Patent
Kondo et al.

(10) Patent No.: US 8,454,752 B2
(45) Date of Patent: Jun. 4, 2013

(54) FOREIGN SUBSTANCE REMOVING APPARATUS, FOREIGN SUBSTANCE REMOVING METHOD, AND STORAGE MEDIUM

(75) Inventors: Masaki Kondo, Nirasaki (JP); Takehiro Shindou, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 578 days.

(21) Appl. No.: 12/635,107

(22) Filed: Dec. 10, 2009

(65) Prior Publication Data

US 2010/0147327 A1 Jun. 17, 2010

Related U.S. Application Data

(60) Provisional application No. 61/159,896, filed on Mar. 13, 2009.

(30) Foreign Application Priority Data

Dec. 15, 2008 (JP) ................................. 2008-318237

(51) Int. Cl.
*B08B 5/00* (2006.01)

(52) U.S. Cl.
USPC .................... 134/1.3; 134/1; 134/19; 134/33; 134/37; 216/63; 216/65

(58) Field of Classification Search
None
See application file for complete search history.

(56) References Cited

U.S. PATENT DOCUMENTS

2008/0017613 A1* 1/2008 Nogami et al. ................ 216/58

FOREIGN PATENT DOCUMENTS

| JP | 2003-197570 | 7/2003 |
|---|---|---|
| JP | 2006-49870 | 2/2006 |
| WO | WO 2008/044394 A1 | 4/2008 |

OTHER PUBLICATIONS

Machine Translation of JP2003-197570 by Takuya Wada, published Jul. 11, 2003.*

* cited by examiner

*Primary Examiner* — Michael Kornakov
*Assistant Examiner* — Ryan Coleman
(74) *Attorney, Agent, or Firm* — Rothwell, Figg, Ernst & Manbeck, P.C.

(57) ABSTRACT

A foreign substance removing apparatus includes a mounting table for mounting and rotating a substrate; and a laser beam irradiation unit for removing foreign substances attached to a surface of the substrate by irradiating foreign substance cleaning laser beam onto the substrate mounted and rotated on the mounting table. In the foreign substance removing apparatus, the laser beam irradiation unit irradiates laser beam having an elongate shaped irradiation cross section onto the surface of the substrate.

11 Claims, 7 Drawing Sheets

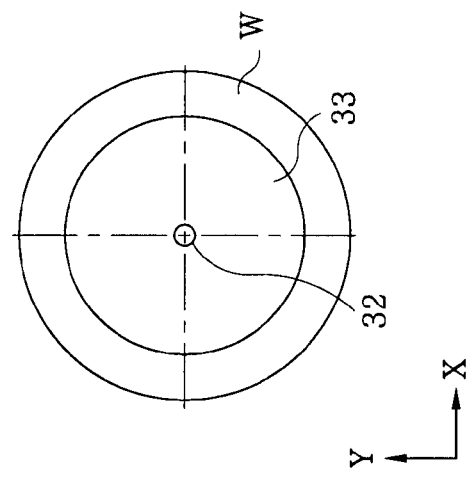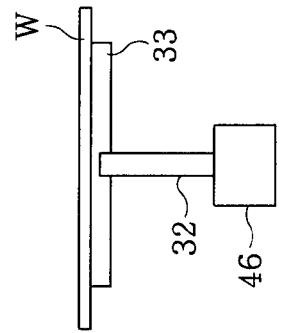
FIG.7A  FIG.7E
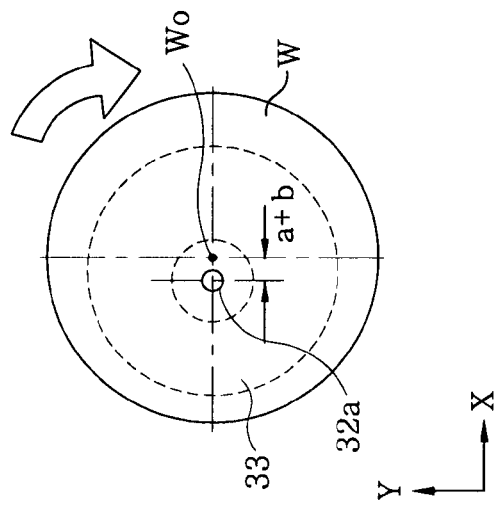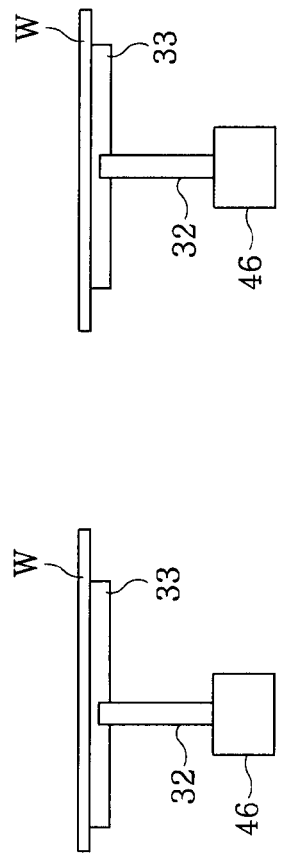
FIG.7C
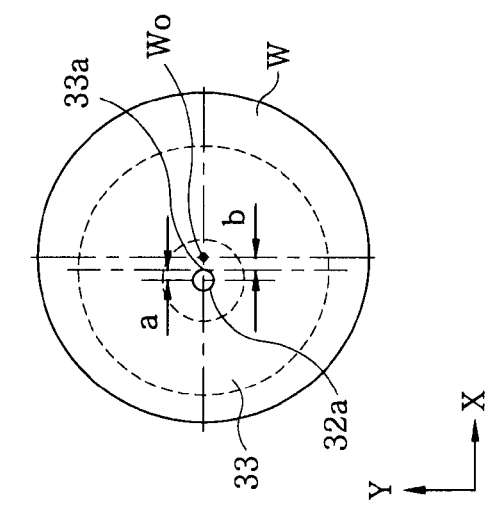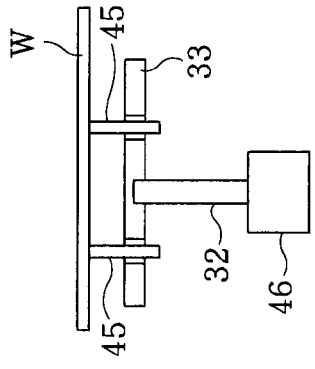
FIG.7B  FIG.7D  FIG.7F

FOREIGN SUBSTANCE REMOVING APPARATUS, FOREIGN SUBSTANCE REMOVING METHOD, AND STORAGE MEDIUM

CROSS-REFERENCE TO RELATED APPLICATION

This application claims the benefit of priority to Japanese Patent Application No. 2008-318237, filed on Dec. 15, 2008, the entire contents of which are incorporated herein by reference.

FIELD OF THE INVENTION

The present invention relates to a foreign substance removing apparatus, a foreign substance removing method and a storage medium; and, more particularly, to an apparatus and a method for removing foreign substances attached to a semiconductor substrate after a plasma etching process.

BACKGROUND OF THE INVENTION

When plasma processing, e.g., plasma etching process, is performed on a wafer as a substrate by using a plasma generated from a CF-based processing gas, CF-based deposits generated by the CF-based processing gas may be attached to a wafer surface. The CF-based deposits attached to the wafer surface are removed by sputtering using the plasma (positive ion). However, a peripheral portion (hereinafter, referred to as a "beveled portion") and a backside flat portion of the wafer is hardly sputtered by a plasma, so that the CF-based deposits attached thereto are not removed.

Thus, the CF-based deposits attached to the beveled portion and the backside flat portion are removed by a post-processing apparatus. To be specific, in the post-processing apparatus, a laser beam spot of, e.g., about Φ0.6 mm, is irradiated onto the beveled portion and the backside flat portion to heat them and, at the same time, ozone gas is supplied thereto. Due to chemical reaction therebetween, the CF-based deposits are decomposed into CO, $CO_2$, and/or $F_2$ and removed.

If a foreign substance removing process is carried out at a high speed in the post-processing apparatus for performing cleaning by removing foreign substances attached to the peripheral portion of the wafer by using a laser beam, materials other than organic materials may be peeled off from the surface of the wafer due to a sharp temperature increase. On the other hand, if the process is carried out at a low speed, processing time increases and, also, a heat transfer from the peripheral portion of the wafer to the surface of the wafer increases, thereby inflicting adverse effects on chips on the surface of the wafer. For that reason, there is required development of a technique capable of effectively removing foreign substances attached to a wafer by omitting unnecessary processes to minimize processing time and optimizing an amount of heat transfer into the wafer as a substrate to be processed.

Meanwhile, Patent Document 1 is a well-known document which discloses a prior art that optimizes processing by adjusting a position of a laser beam source with respect to a wafer as a substrate to be processed. In the Patent Document 1, a substrate processing apparatus includes a vacuum chuck for holding and rotating a wafer W in an approximately horizontal direction; and an optical etching device for irradiating laser beam onto a peripheral portion of the wafer W held by the vacuum chuck. This substrate processing apparatus removes a copper thin film from the peripheral portion of the wafer W by irradiating Xe laser beam onto the peripheral portion of the wafer W rotated while being held by the vacuum chuck, by the optical etching device which is positioned conforming to a size of an outer diameter of the wafer.
[Patent Document 1] Japanese Patent Laid-open Application No. 2003-197570

However, the prior art is disadvantageous in that the apparatus becomes complicated and scaled up because it requires a detection unit for detecting an outer diameter of the substrate to be processed in addition to a laser beam irradiation unit for processing a substrate. Besides, there is likelihood that the amount of heat transfer into the substrate to be processed is not optimized and a surface other than a target surface of the substrate to be processed is excessively heated.

SUMMARY OF THE INVENTION

In view of the above, the present invention provides an apparatus for removing foreign substances attached to a substrate that has been subjected to predetermined processes, which can shorten processing time by omitting unnecessary processes and exclude unnecessary heating by optimizing an amount of heat transfer into the substrate, a method for removing foreign substances by using the apparatus and a storage medium.

In accordance with a first aspect of the present invention, there is provided a foreign substance removing apparatus including a mounting table for mounting and rotating a substrate; and a laser beam irradiation unit for removing foreign substances attached to a surface of the substrate by irradiating foreign substance cleaning laser beam onto the substrate mounted and rotated on the mounting table, wherein the laser beam irradiation unit irradiates laser beam having an elongate shaped irradiation cross section onto the surface of the substrate.

In accordance with a second aspect of the present invention, there is provided a foreign substance removing method for removing foreign substances attached to a substrate by using a foreign substance removing apparatus including a mounting table for mounting and rotating a substrate and a laser beam irradiation unit for removing foreign substances attached to a surface of the substrate by irradiating foreign substance cleaning laser beam onto the substrate mounted and rotated on the mounting table, the foreign substance removing method including irradiating a laser beam having an elongate shaped irradiation cross section from the laser beam irradiation unit onto the surface of the substrate.

In accordance with a third aspect of the present invention, there is provided a foreign substance removing method for removing foreign substances attached to a substrate by using a foreign substance removing apparatus including a mounting table for mounting and rotating a substrate and a laser beam irradiation unit for removing foreign substances attached to a surface of the substrate by irradiating foreign substance cleaning laser beam onto the substrate mounted and rotated on the mounting table, the foreign substance removing method including irradiating laser beam for measuring an outer diameter of the substrate from the laser beam irradiation unit onto an end portion of the substrate mounted and rotated on the mounting table.

The foreign substance removing method further includes detecting a light receiving output of the laser beam which is not blocked by the end portion of the substrate among the irradiated laser beam, by a laser beam receiving unit; detecting a rotation angle of the rotating substrate; calculating an outer diameter of the substrate based on the detected light receiving output and the detected rotation angle; and decomposing and removing the foreign substances attached to the surface of the substrate located within a range from an outer end portion of the substrate by injecting a processing gas that reacts with the foreign substances and irradiating the foreign substance cleaning laser beam having an elongate shaped irradiation cross section from the laser beam irradiation unit toward the surface of the substrate within the range, the range being determined based on the calculated outer diameter of the substrate.

In accordance with a fourth aspect of the present invention, there is provided a computer readable storage medium for storing therein a program executed by the computer which realizes a foreign substance removing method for removing foreign substances attached to a substrate by using a foreign substance removing apparatus including a mounting table for mounting and rotating a substrate and a laser beam irradiation unit for removing foreign substances attached to a surface of the substrate by irradiating foreign substance cleaning laser beam onto the substrate mounted and rotated on the mounting table, the foreign substance removing method including irradiating a laser beam having an elongate shaped irradiation cross section from the laser beam irradiation unit onto the surface of the substrate.

In accordance with a fifth aspect of the present invention, there is provided a computer readable storage medium for storing therein a program executed by the computer which realizes a foreign substance removing method for removing foreign substances attached to a substrate by using a foreign substance removing apparatus including a mounting table for mounting and rotating a substrate and a laser beam irradiation unit for removing foreign substances attached to a surface of the substrate by irradiating foreign substance cleaning laser beam onto the substrate mounted and rotated on the mounting table, the foreign substance removing method including irradiating laser beam for measuring an outer diameter of the substrate from the laser beam irradiation unit onto an end portion of the substrate mounted and rotated on the mounting table.

Further, the foreign substance removing method includes detecting a light receiving output of the laser beam which is not blocked by the end portion of the substrate among the irradiated laser beam, by a laser beam receiving unit; detecting a rotation angle of the rotating substrate; and calculating an outer diameter of the substrate based on the detected light receiving output and the detected rotation angle. Moreover, the foreign substance removing method includes decomposing and removing the foreign substances attached to the surface of the substrate located within a range from an outer end portion of the substrate by injecting a processing gas that reacts with the foreign substances and irradiating the foreign substance cleaning laser beam having an elongate shaped irradiation cross section from the laser beam irradiation unit toward the surface of the substrate within the range, the range being determined based on the calculated outer diameter of the substrate.

BRIEF DESCRIPTION OF THE DRAWINGS

The objects and features of the present invention will become apparent from the following description of preferred embodiments, given in conjunction with the accompanying drawings, in which:

FIGS. 7A to 7F explain a method for detecting positional deviation of the wafer and correcting the deviation.

DETAILED DESCRIPTION OF THE EMBODIMENT

Hereinafter, an embodiment of the present invention will be described in more detail with reference to accompanying drawings which form a part hereof.

The present invention has a purpose of improving processing efficiency by removing adverse effects inflicted on a wafer W as a substrate to be processed which are caused by excessive heating in an apparatus and a method for decomposing deposits as foreign substances attached to a surface of the wafer W into CO, $CO_2$, $F_2$ and/or the like and removing them, by irradiating a laser beam onto the deposits and, at the same time, injecting a processing gas that reacts therewith. In order to achieve the above-described purpose, the inventors of the present invention have studied relationship between a spot shape (hereinafter, referred to as an "irradiation cross sectional shape") of a laser beam and a temperature of a target surface of the wafer W, or the like.

As a consequence, they have conceived the present invention by discovering that the target surface of the wafer W can be effectively heated and also that the effects inflicted to the peripheral portion of the wafer W can be ignored when the irradiation cross section of the laser beam has a elongated shape instead of a circular shape. Therefore, in the apparatus and the method for removing foreign substances in accordance with the present invention, a laser beam having an elongate shaped irradiation cross section is irradiated from the laser beam irradiation unit onto the substrate to be processed.

First of all, a principle of the present invention will be explained with reference to FIGS. 1A to 1C.

Figure 1A:
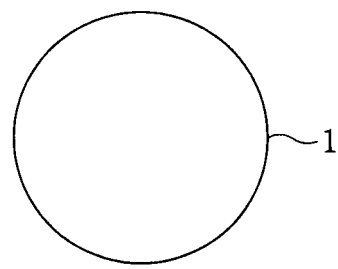
FIGS. 1A to 1C are views for explaining a principle of the present invention.

FIG. 1A shows a circular irradiation surface 1 which is an irradiation cross sectional surface of a laser beam in the prior art. Conventionally, the entire circular irradiation surface 1 is heated to a temperature at which deposits are decomposed, e.g., about 350° C. However, when an irradiation cross sectional surface of the laser beam is an elongate shaped irradiation surface 2 as shown in FIG. 1B, an irradiation area is reduced by an amount corresponding to a portion 3 (indicated by slant lines in FIG. 1C) that is obtained by removing the elongate shaped irradiation surface 2 from the circular irradiation surface 1. Accordingly, unnecessary heating can be prevented.

Figure 1B:
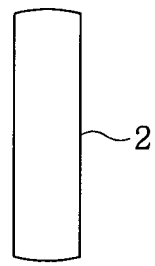
Figure 1C:
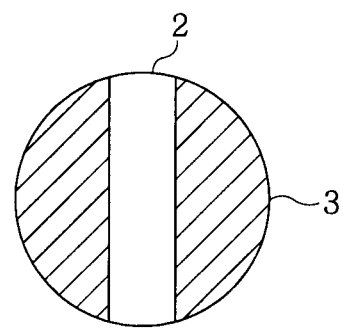

Meanwhile, when the circular wafer W that is rotating while being held on a mounting table is irradiated to be scanned with the laser beam directed to move along a radial direction of the wafer W, e.g., to the right in FIGS. 1A to 1C, an irradiation surface of the laser beam is formed on the wafer W. At that time, an effective area of the irradiation surface of the laser beam is mainly determined by a length (width) of the irradiation surface in a direction along the relative moving direction of the laser beam, while a width of the irradiation surface in a direction perpendicular to the moving direction of the laser beam hardly play an effective role.

Therefore, portions 3 indicated by slant lines in FIG. 1C become a surplus irradiation surface, for example, when the laser beam is irradiated to the right in FIGS. 1A to 1C. The laser beam irradiated to the surplus irradiation surface is useless, and the surplus irradiation surface irradiated by the laser beam hinders dissipation of residual heat generated by the laser beam irradiated to a proper irradiation surface (indicated by a reference numeral 2 in FIG. 1B) to heat a target surface of the wafer W. This results in overheating of the proper irradiation surface and the peripheral portions thereof.

The present invention optimizes an amount of heat transfer into the surface of the wafer W by minimizing a surplus irradiation surface of the laser beam. In the embodiment of the present invention, a length of the elongate shaped irradiation cross section of the laser beam is, e.g., about 1.2 mm, and a width thereof is, e.g., about 0.6 mm. Moreover, the elongated shape in the present invention refers not to mathematically strictly a rectangular shape, but to a substantially elongated square shape having a length and a width. Further, the irradiation cross sectional shape of the laser beam is not limited to an elongated shape, and may be an elliptical shape.

If the laser beam having an elongate shaped irradiation cross section is irradiated from the laser beam irradiation unit onto the surface of the substrate, it is possible to heat only a portion that needs to be heated in the surface of the substrate. Accordingly, the heating is optimized, and the heating controllability is improved.

Hereinafter, the embodiment of the present invention will be described with reference to the accompanying drawings.

Figure 2:
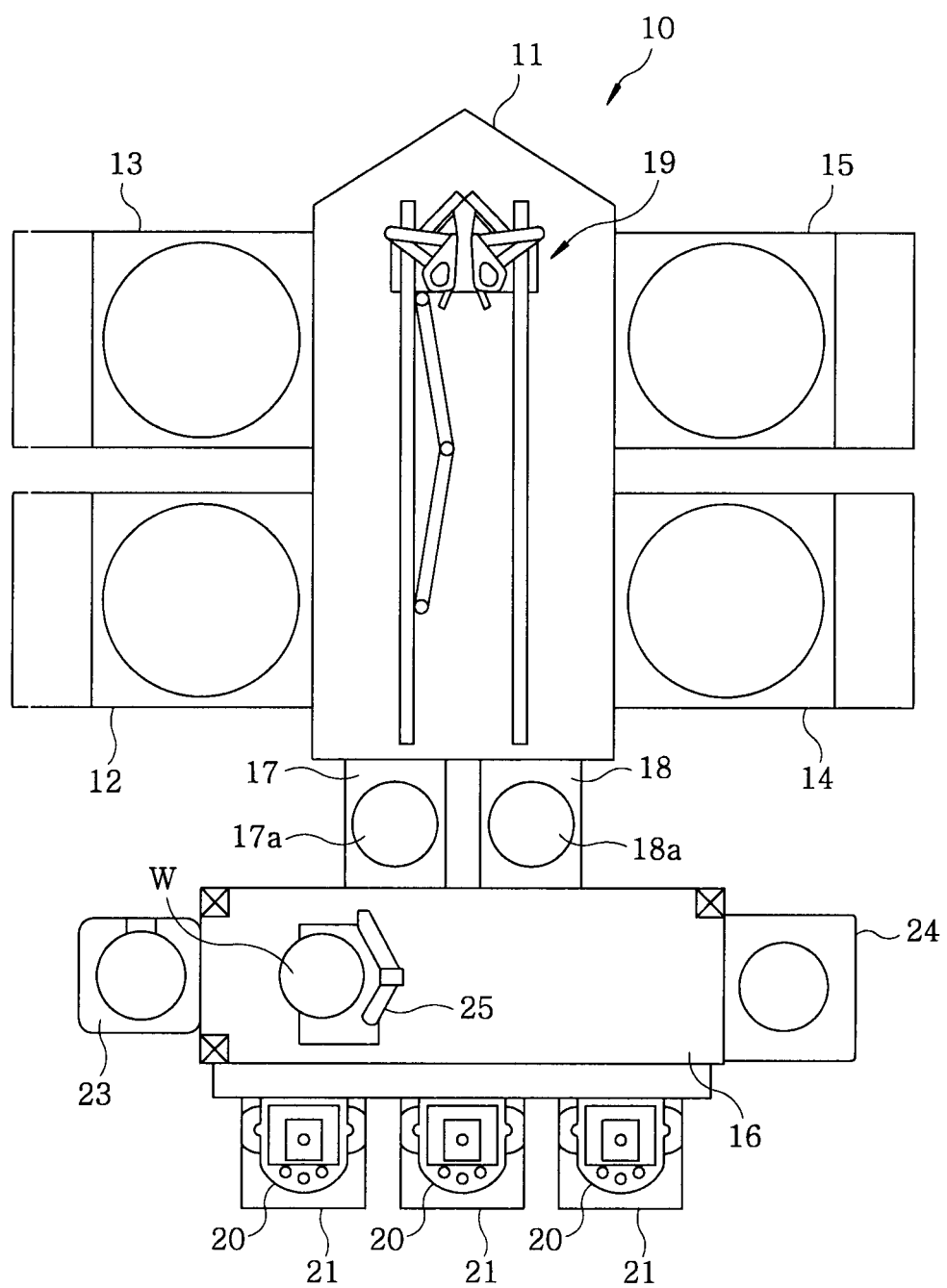
FIG. 2 describes a schematic configuration of a substrate processing system including a beveled portion cleaning apparatus as an apparatus for removing foreign substances in accordance with an embodiment of the present invention.

FIG. 2 describes a schematic configuration of a substrate processing system including a beveled portion cleaning apparatus as an apparatus for removing foreign substances in accordance with an embodiment of the present invention.

Referring to FIG. 2, a substrate processing system 10 includes a transfer module 11 formed in a hexagonal shape seen from the top; two process modules 12, 13 connected to one side of the transfer module 11; two process modules 14, 15 connected to the other side of the transfer module 11 to face the two process modules 12, 13; and a loader module 16 serving as a rectangular transfer chamber. Further, the substrate processing system 10 includes two load-lock modules 17, 18 disposed between the transfer module 11 and the loader module 16 to connect therebetween.

The transfer module 11 includes therein a transfer arm 19 capable of extending, contracting, and rotating, which in turn transfers a wafer W between process modules 12 to 15 and load-lock modules 17, 18.

The process module 12 includes a processing container (chamber) accommodating a wafer W. A gaseous mixture of CF-based deposition processing gas, e.g., $CHF_3$ gas, and halogen-based gas, e.g., HBr gas, is introduced as a processing gas into the chamber and an electric field is generated in the chamber. Thus, plasma is generated from the introduced processing gas and the wafer W is etched by the plasma.

Each of the interiors of the transfer module 11 and the process modules 12 to 15 is maintained in a decompressed state, and the transfer module 11 is connected to each of the process modules 12 to 15 via vacuum gate valves not shown.

Further, the pressure in the loader module 16 is maintained at atmospheric pressure, whereas the pressure in the transfer module 11 is maintained in a vacuum. Therefore, the load-lock modules 17, 18 have respective vacuum gate valves (not shown) at sides thereof connected to the transfer module 11, and have respective atmospheric door valves (not shown) at the other sides thereof connected to the loader module 16. Accordingly, the load-lock modules 17, function as a vacuum preliminary transfer chambers of which inner pressures can be adjusted. Furthermore, the load-lock modules 17, 18 have respective wafer mounting tables 17a, 18a for temporarily mounting thereon the wafer W transferred between the loader module 16 and the transfer module 11.

Connected to the loader module 16 are three FOUP (Front Opening Unified Pod) mounting tables 21 for mounting thereon FOUPs 20 which serve respectively as containers accommodating, e.g., 25 sheets of wafers W. Further, an orienter 23 for pre-aligning a position of a wafer W unloaded from the FOUPs 20 and a beveled portion cleaning apparatus 24 serving as a post-processing apparatus are connected to the loader module 16. The orienter 23 is disposed at one end of the loader module 16 in a longitudinal direction thereof, and the beveled portion cleaning apparatus 24 is arranged at the other end of the loader module 16 in the longitudinal direction thereof.

The loader module 16 has therein a SCARA type dual transfer arm 25 for transferring wafers W. The transfer arm 25 unloads a wafer W from the FOUPs 20 mounted on the FOUP mounting tables 21 and transfers the unloaded wafer W into and from the load-lock modules 17, 18, the orienter 23, or the beveled portion cleaning apparatus 24.

Figure 3:
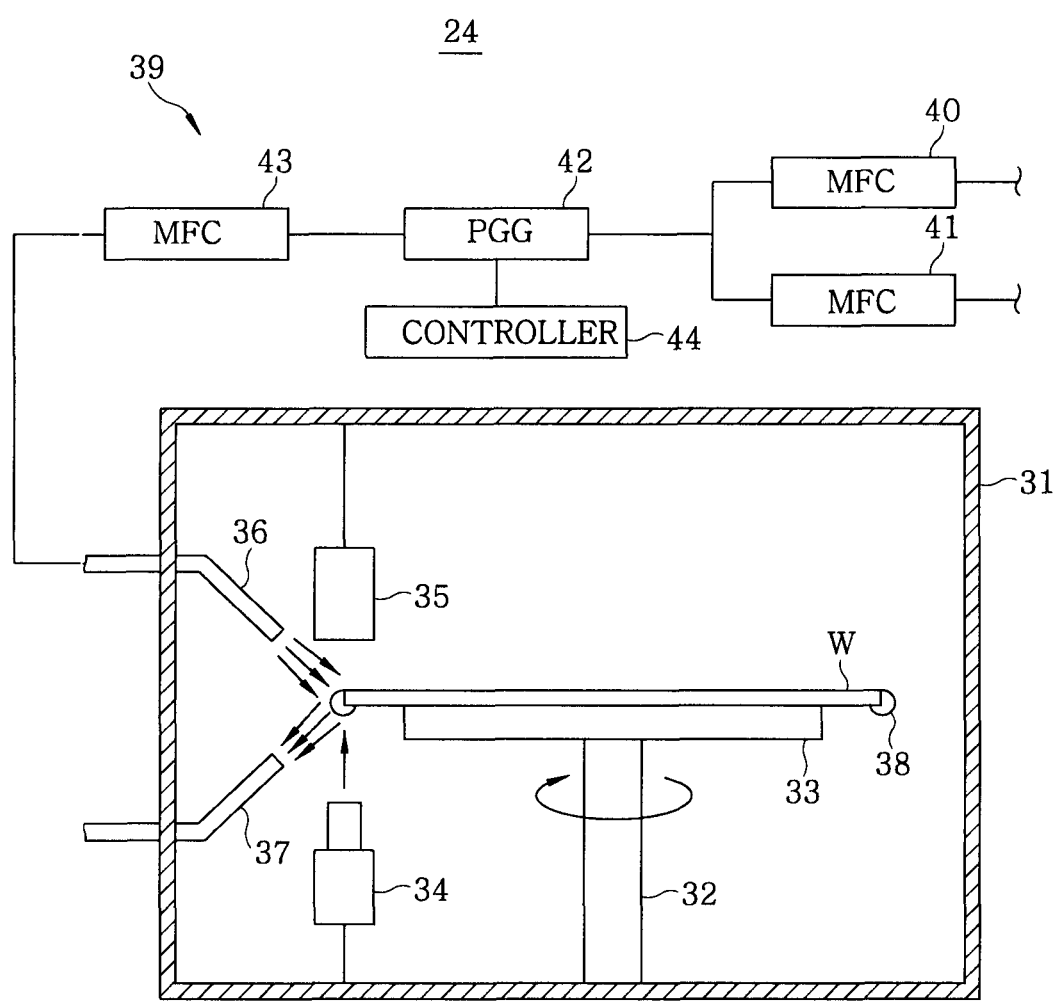
FIG. 3 provides a cross sectional view showing a schematic configuration of the beveled portion cleaning apparatus shown in FIG. 2.

FIG. 3 provides a cross sectional view showing a schematic configuration of the beveled portion cleaning apparatus 24 shown in FIG. 2.

Referring to FIG. 3, the beveled portion cleaning apparatus 24 has a housing-shaped chamber 31 for accommodating a processing target wafer W that has been subjected to a predetermined processing; and a disc-shaped stage 33 disposed in the chamber 31 and supported by a shaft 32 installed vertically on the bottom of the chamber 31. The wafer W is mounted on the stage 33 and a diameter of the stage 33 is set to be smaller than that of the wafer W. Therefore, the beveled portion of the wafer W protrudes from the stage 33, and the surface and the backside of the beveled portion are exposed to a space in the chamber 31.

The stage 33 has a mechanism for adsorbing and holding the wafer W, e.g., an electrostatic chuck or a vacuum chuck. The shaft 32 rotates about a central axis thereof and pivotably supports the wafer W mounted on the stage 33. Provided in the chamber 31 are a laser beam irradiating unit 34 disposed in the back side of the beveled portion of the wafer W, and a power meter 35 serving as a laser beam receiving unit and facing the laser beam irradiating unit to sandwich the beveled portion of the wafer W therebetween. Further, a gas supply nozzle 36 for injecting a processing gas containing ozone toward the beveled portion of the wafer W and a gas suction nozzle 37 for sucking and discharging gas around the beveled portion are provided in the chamber 31.

The beveled portion cleaning apparatus 24 supplies the processing gas toward the CF-based deposits attached to the beveled portion of the wafer W and irradiates cleaning laser beam to apply thermal energy. The laser beam irradiation unit 34 is a device for irradiating a laser beam having an elongate shaped irradiation cross section and the cleaning laser beam irradiated from the laser beam irradiation unit 34 onto the surface of the wafer W has an elongate shaped cross section.

The ozone gas contained in the processing gas chemically reacts with the CF-based deposits 38 such that they are decomposed into CO, $CO_2$, $F_2$ and/or the like. The chemical reaction is facilitated by the thermal energy applied by the cleaning laser beam. Most of CO, $CO_2$, $F_2$ or the like which are produced by a decomposition are sucked and removed by the gas suction nozzle 37.

Further, a temperature of the beveled portion of the wafer W is determined based on an output of the cleaning laser beam irradiated onto the wafer W and a rotation speed of the wafer W. Here, the wafer W rotates on a horizontal plane, so that the entire beveled portion of the wafer W passes in front of the laser beam irradiation unit 34 or the gas supply nozzle 36. As a consequence, the CF-based deposits 38 are removed from the entire beveled portion.

The beveled portion cleaning apparatus 24 has a fan filter unit (not shown) disposed at an upper portion of the chamber 31; and a gas exhaust unit (not shown) disposed at a lower portion of the chamber 31. The fan filter unit generates a downflow flowing from top to bottom in the chamber 31. The downflow sweeps away CO, $CO_2$ and/or $F_2$ that have not been sucked by the gas suction nozzle 37 and removes them from the chamber 31. Further, the downflow prevents particles generated by rotation of the shaft 32 or the stage 33 or the CF-based deposits 38 unexpectedly peeled off from the beveled portion from floating up above the wafer W in the chamber 31.

Moreover, the beveled portion cleaning apparatus 24 includes a processing gas supply system 39. The processing gas supply system 39 has an oxygen gas mass flow controller (MFC) 40 connected to an oxygen gas supply unit (not shown), for measuring and controlling a flow rate of oxygen gas; and a nitrogen gas mass flow controller (MFC) 41 connected to a nitrogen gas supply unit (not shown), for measuring and controlling a flow rate of nitrogen gas.

The processing gas supply system 39 further includes a processing gas generator (PGG) 42 connected to the oxygen gas mass flow controller 40 and the nitrogen gas mass flow controller 41; a processing gas mass flow controller (MFC) 43 provided between the processing gas generator 42 and the gas supply nozzle 36, for measuring and controlling a flow rate of the processing gas; and a controller 44 for mainly controlling an operation of the processing gas generator 42.

The processing gas generator 42 generates a processing gas containing ozone gas from a source gas which contains oxygen gas having a predetermined flow rate controlled by the oxygen gas mass flow controller 40 and nitrogen gas having a small flow rate controlled by the nitrogen gas mass flow controller 41.

Hereinafter, a foreign substance removing method in accordance with an embodiment of the present invention which uses the beveled portion cleaning apparatus 24 described above will be described in detail with reference to FIGS. 4 to 6.

Figure 4:
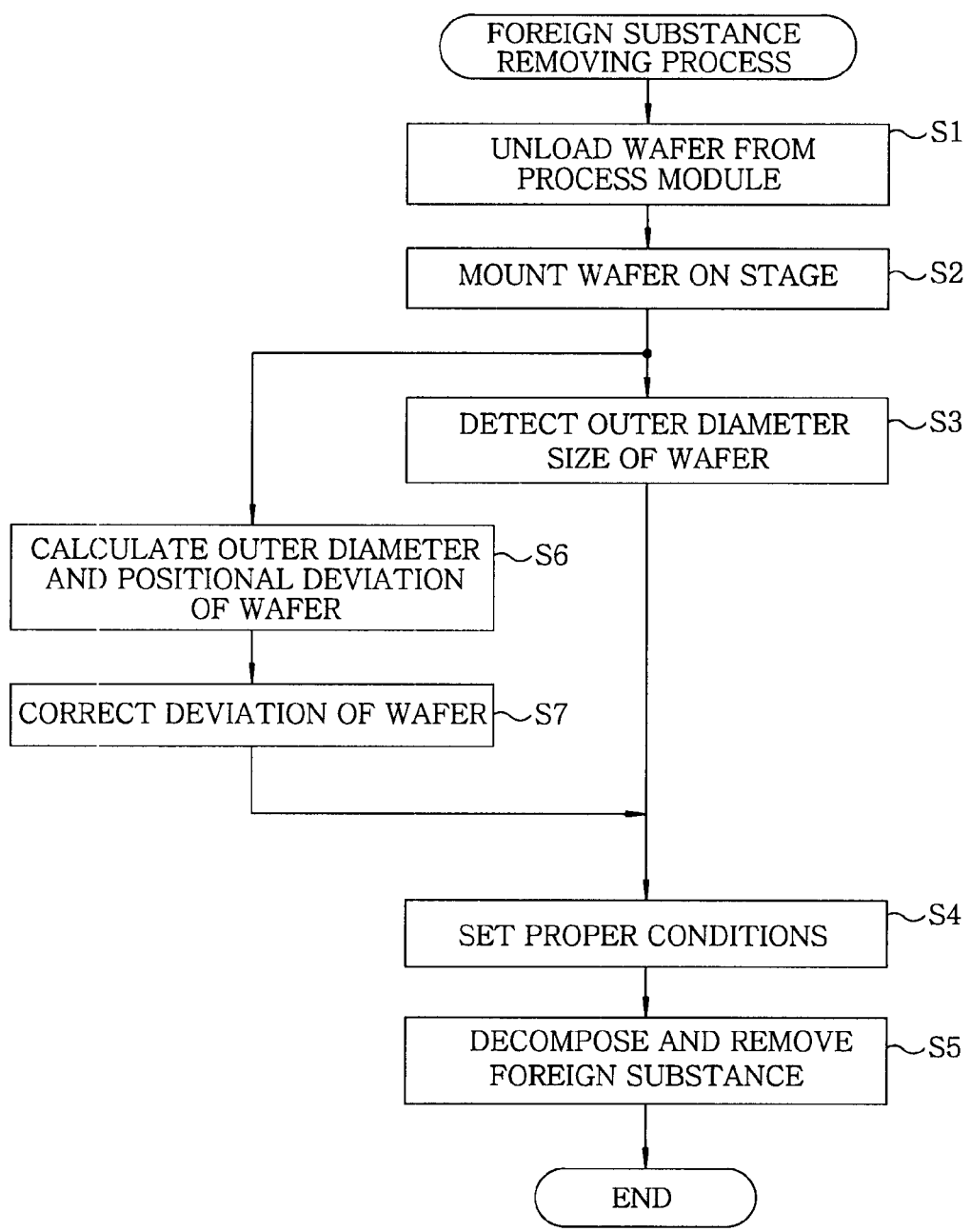
FIG. 4 presents a flowchart of a method for removing foreign substances in accordance with an embodiment of the present invention.

FIG. 4 is a flowchart of the foreign substance removing method of this embodiment.

Referring to FIG. 4, to perform a foreign substance removing process for removing foreign substances attached to a surface of a substrate, first of all, the wafer W as a substrate to be processed which has been subjected to a predetermined processing in the process module 12 shown in FIG. 2 is unloaded from the chamber of the process module 12 by the transfer arm 19 (step S1). The unloaded wafer is loaded into the loader module 16 via, e.g., the load-lock module 18, and then the wafer W loaded into the loader module 16 is transferred into the beveled portion cleaning apparatus 24 by the transfer arm 25. Next, the wafer W is mounted on the stage 33 in the chamber 31 of the beveled portion cleaning apparatus 24 (step S2).

Subsequently, an outer diameter size of the wafer W mounted on the stage 33 of the beveled portion cleaning apparatus 24 is detected (step S3) and, then, proper conditions for cleaning and removing deposits of foreign substances are set based on the detected outer diameter size (step S4). The detection of the outer diameter size of the wafer W and the setting of the proper conditions for cleaning will be described later. Thereafter, the cleaning laser beam having an elongate shaped irradiation cross section is irradiated onto the wafer W under the set proper conditions. Thus, foreign substances attached to the beveled portion, i.e., polymers deposited on the beveled portion are decomposed and removed (step S5), and then this process is ended.

Figure 5:
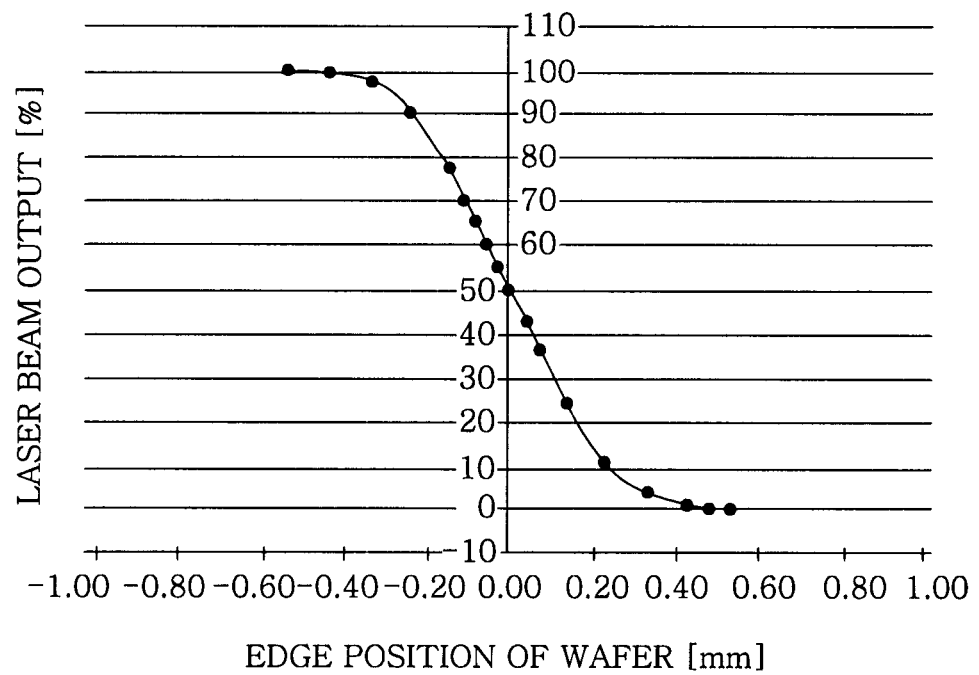
FIG. 5 represents a diagram (calibration curve) describing relationship between an output of a laser beam for measuring an outer diameter of a wafer W which is received by a light receiving unit and a deviation amount of an edge position of the wafer W.

FIG. 5 provides a graph showing a relationship between a laser beam output (%) that is used to detect the outer diameter size of the wafer W and an edge position (mm) of the wafer, which is calculated in advance.

In the beveled portion cleaning apparatus 24, when a laser beam for measuring the outer diameter size is irradiated from the laser beam irradiation unit 34 to an end portion of the wafer W and it is not blocked at all by the wafer W, 100% of the irradiated laser beam reaches the power meter 35. On the other hand, when a part of the irradiated laser beam is blocked by the end portion of the wafer W, the rest of the laser beam reaches the power meter 35. If the amount of the blocked laser beam varies depending on an end portion of the rotating wafer W, the power meter 35 can measure a light receiving output of the laser beam corresponding to a difference between, e.g., a nominal outer diameter and an actual outer diameter of the wafer W at a predetermined position of the wafer W.

Thus, a relationship between the difference (hereinafter, referred to as an edge position) between the nominal outer diameter and the actual outer diameter and the light receiving output of the outer diameter measuring laser beam corresponding thereto can be in advance provided in the power meter 35. Then, the power meter 35 can detect the difference between the nominal outer diameter and the actual outer diameter of the wafer W based on the light receiving output of the laser beam and also, based on the detected result, the actual outer diameter of the wafer W can be obtained.

The laser beam irradiation unit 34 of the beveled portion cleaning apparatus 24 is arranged at a position where a part, e.g., a half, of the outer diameter measuring laser beam irradiated from the laser beam irradiation unit 34 passes the end portion of the wafer W and reaches the power meter 35, while the rest, e.g., the other half thereof is blocked by the end portion of the wafer W. Thus, the actual outer diameter of the wafer W can be measured without changing the position of the power meter 35.

In FIG. 5, a vertical axis indicates an output of the outer diameter measuring laser beam received by the power meter 35 [a ratio (%) of an output of the laser beam that is not blocked by the end portion of the wafer W to an output of the laser beam irradiated from the laser beam irradiation unit 34], and a horizontal axis represents the difference [edge position of the wafer W] (mm) between, e.g., a nominal outer diameter and an actual outer diameter in a predetermined position on the wafer W.

When the light receiving output of the laser beam is between about 10% and about 90%, the laser beam receiving output and the edge position of the wafer W correspond to each other linearly and the actual outer diameter of the wafer W [nominal outer diameter+edge position of the wafer W] can be obtained by the power meter 35 based on the light receiving output of the outer diameter measuring laser beam. Further, a rotation angle $\theta$ of the wafer W at that moment is detected by a rotation angle detector (not shown) such as a rotary encoder or the like and a relationship between the edge position of the wafer W and the rotation angle θ can be obtained.

The light receiving output data of the outer diameter measuring laser beam obtained by the power meter 35 and the rotation angle data of the wafer W detected by the rotation angle detector are inputted to a control unit (not shown) of the beveled portion cleaning apparatus 24. The control unit to which the data are inputted calculates an actual outer diameter of the wafer W based on the input data, the calibration curve showing the relationship between the light receiving output of the laser beam and the edge position of the wafer W which is shown in FIG. 5, the nominal outer diameter and the like.

When the actual outer diameter of the wafer W is calculated by the control unit of the beveled portion cleaning apparatus 24, the conditions for removing (cleaning) foreign substances from the wafer W are properly set based on the calculated actual outer diameter of the wafer W. The foreign substance removing process is carried out under the proper conditions.

In other words, the calculated outer diameter of the wafer W is fed back as a cleaning starting position of the wafer W, and the foreign substances are removed, under the proper conditions for removing foreign substance, from the beveled portion and the backside flat portion of the wafer W, or from the beveled portion, the backside flat portion, and the intermediate portion between the beveled portion and the backside flat portion (hereinafter, simply referred to as an "intermediate portion").

FIGS. 6A to 6D are views for explaining the proper condition setting and the foreign substance removing method in this embodiment.

As for the beveled portion of the wafer W, the cleaning laser beam is irradiated from a direction normal to a curved cross section of the beveled portion. Specifically, the foreign substance cleaning laser beam having an elongate shaped irradiation cross section whose longitudinal side is arranged along, e.g., a scanning direction of the laser beam, is irradiated from an inclined direction (d1 direction) shown in FIG. 6A. At this point, since an area normal to an irradiated laser beam in a surface of the beveled portion is smaller than that in the backside flat portion, a laser beam scanning speed on the beveled portion is reduced compared to that on the backside flat portion, thereby ensuring to maintain a temperature required to decompose the polymers of foreign substances on the beveled portion.

Meanwhile, as for the backside flat portion of the wafer W, the foreign substance cleaning laser beam having an elongate shaped irradiation cross section is also irradiated from a direction d3 perpendicular to a cleaning surface of the wafer W. As mentioned above, an angle of the laser beam irradiated onto the backside flat portion can be easily adjusted to a right angle. Accordingly, a temperature of the backside flat portion will excessively rise if the scanning speed of the laser beam on the backside flat portion is equal to that on the beveled portion, which may cause deformation or melting of the wafer W. For that reason, the excessive heating is prevented by increasing the scanning speed of the foreign substance cleaning laser beam on the backside flat portion compared to that on the beveled portion.

Alternatively, the temperature required to decompose foreign substances may be ensured by reducing the irradiation power of the foreign substance cleaning laser beam having an elongate shaped irradiation cross section onto the backside flat portion compared to that onto the beveled portion. Moreover, irradiation conditions of the foreign substance cleaning laser beam having an elongate shaped irradiation cross section which are applied to the intermediate portion are properly selected between those applied to the beveled portion and those applied to the backside flat portion. For example, the foreign substance cleaning laser beam may be irradiated in a direction d2 shown in FIGS. 6A to 6D.

After the laser beam irradiation conditions suitable for respective cleaning regions of the wafer W are set, an ozone-containing gas is supplied as a processing gas toward the beveled portion of the rotating wafer W and, substantially at the same time, a cleaning laser beam having an elongate shaped irradiation cross section whose longitudinal side is aligned along a scanning direction thereof, is irradiated from the laser beam irradiation unit to apply thermal energy thereto. Accordingly, the CF-based deposits 38 attached to the beveled portion, the intermediate portion and the backside flat portion of the wafer W are decomposed by chemical reaction with the ozone gas and then are removed. Decomposition product gases, e.g., $CO$, $CO_2$, $F_2$ and/or the like, are sucked by the gas suction nozzle 37 and then removed.

Figure 6A:
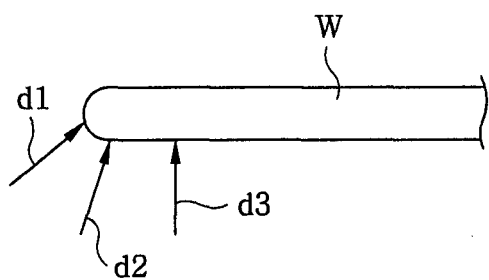
FIGS. 6A to 6D explain a method for setting proper conditions and removing foreign substances in the embodiment of the present invention.
Figure 6B:
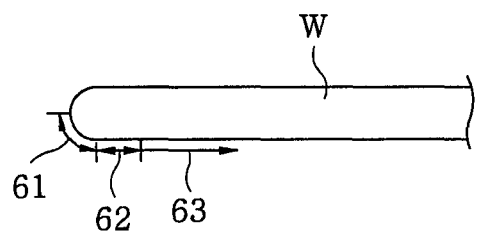
Figure 6C:
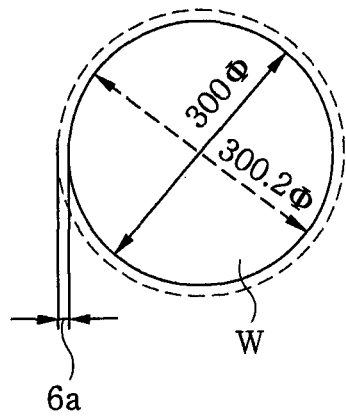
Figure 6D:
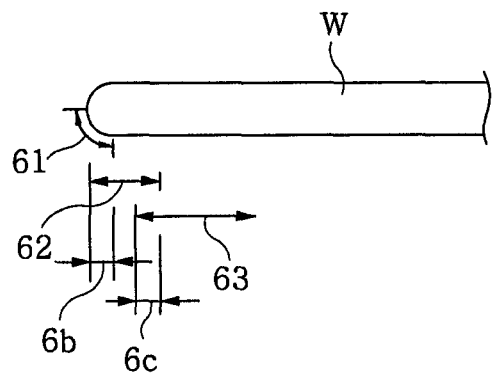

Conventionally, an accurate outer diameter of the wafer W is not measured and a value that an error of, e.g., about 0.2 mm is added to, e.g., Φ300 mm of the wafer W is assumed as an outer diameter of a wafer W (see FIG. 6C). Therefore, the processing is performed to have overlapped portions at boundaries between laser beam irradiation regions (hereinafter, referred to as a "cleaning region") in order to prevent laser beam irradiation errors at the boundaries, as shown in FIG. 6D. Due to that reason, the cleaning laser beam may be redundantly irradiated onto an area corresponding to a difference 6a between an actual outer diameter of the wafer W and an outer diameter thereof in which the error is included (FIG. 6C), an area corresponding to an overlapped portion 6b between a beveled portion cleaning region 61 and an intermediate portion cleaning region 62, and an area corresponding to an overlapped portion 6c between the intermediate portion cleaning region 62 and a backside flat portion cleaning region 63. As the processing area increases, the processing time increases, thereby lowering a throughput of the processing.

However, an actual outer diameter of the wafer W is measured in the embodiment of the present invention. Thus, it is possible to accurately recognize the beveled portion cleaning region 61, the intermediate portion cleaning region 62, and the backside flat portion cleaning region 63 of the wafer W shown in FIG. 6B. Hence, the foreign substance cleaning process can be carried out under the conditions suitable for the respective cleaning regions.

In accordance with this embodiment, the irradiation cross section of the cleaning laser beam is an elongated shape whose longitudinal side is arranged along a scanning direction of the laser beam. Therefore, the amount of the heat transfer into the wafer W can be optimized by effectively heating only a target surface and, also, the foreign substances and the ozone-containing gas can react with each other at a proper temperature. Accordingly, the foreign substances can be effectively decomposed into $CO$, $CO_2$, $F_2$ and/or the like and removed. Further, since the laser beam irradiation width along the laser beam scanning direction increases, a required rotation number of the wafer decreases, thereby shortening the processing time.

Besides, in accordance with this embodiment, after the outer diameter of the wafer W as a substrate to be processed is accurately measured, the beveled portion cleaning region 61, the intermediate portion cleaning region 62 and the backside flat portion cleaning region 63 of the wafer W are accurately recognized. Accordingly, the foreign substance removing process can be performed under the conditions optimally set for the respective regions. Therefore, unnecessary processes can be omitted and the processing time can be shortened.

Furthermore, in accordance with this embodiment, the actual outer diameter of the wafer W is measured by irradiating the laser beam for measuring an outer diameter of the wafer W onto the end portion thereof by using conventional equipments. Thus, the conventional equipments can be effectively utilized without requiring an additional device for measuring the outer diameter of the wafer W. As a consequence, the post-processing apparatus can be scaled down, and the costs can be reduced.

In addition, with this embodiment, the outer diameter of the wafer W can be accurately detected by using the pre-obtained calibration curve showing the relationship between the light receiving output of the laser beam and the edge position of the wafer W.

Although the irradiation cross section of the cleaning laser beam is an elongated shape whose longitudinal side is arranged along the scanning direction of the laser beam in this embodiment, the elongate shaped laser beam irradiation cross section whose width side is arranged along the scanning direction of the laser beam may be used. Accordingly, the amount of the heat transfer into the wafer W can be optimized. Further, since the irradiation width perpendicular to the laser beam scanning direction increases, the processing time can be shortened by making the rotation speed of the wafer W as a substrate to be processed faster. In this embodiment, the laser beam is scanned onto the circular flat wafer W in a radial direction thereof.

In this embodiment, as for a method for providing an elongate shaped laser beam irradiation cross section, there is known a method for providing an elongated shape or an elliptical laser beam irradiation cross section by arranging a baffle plate which opens in an elongated shape between the laser beam irradiation unit and an irradiation target object (wafer W). Alternatively, an elongated shape or an elliptical laser beam irradiation cross section may be provided by interposing a cylindrical lens between the laser beam irradiation unit and the irradiation target object (wafer W).

In this embodiment, the output power of the outer diameter measuring laser beam and that of the foreign substance cleaning laser beam having an elongate shaped irradiation cross section are not particularly limited. However, they are adjusted to a level at which the aforementioned purposes can be achieved and the excessive heating of the wafer W can be prevented. This is because the excessive heating causes deformation, melting or the like of the wafer W.

Hereinafter, a modified embodiment of the foreign substance removing method will be explained.

In this embodiment, instead of the step S3 in the foreign substance removing process described in FIG. 4, there is provided a step of calculating an outer diameter of the wafer W and a positional deviation of the wafer W based on the output data of the outer diameter measuring laser beam received by the power meter 35 (step S6). When the power meter 35 receives a part of the outer diameter measuring laser beam which is not blocked by the end portion of the rotating wafer W whose center $W_0$ is displaced from a center $32a$ of the shaft 32 as a center of rotation of the wafer W, the edge position of the rotating wafer W shown in FIG. 5 changes along the sine curve. Therefore, the positional deviation and the outer diameter of the wafer W can be obtained based on the sine curve.

Upon completing the calculation of the outer diameter and the deviation of the wafer W, first of all, the deviation of the wafer W is corrected (step S7). Next, the calculated outer diameter of the wafer W is fed back as a cleaning start position of the wafer W. Thus, optimal conditions for the beveled portion and the backside flat portion of the wafer W, or the beveled portion, the intermediate portion and the backside flat portion are set (step S4). Thereafter, the foreign substance removing process is performed under the proper conditions (step S5).

Hereinafter, the method for detecting a positional deviation of the wafer W and correcting the deviation will be explained with reference to FIGS. 7A to 7F.

FIGS. 7A to 7F are views for explaining the method for detecting a positional deviation of the wafer W and correcting the displacement.

Referring to FIGS. 7A and 7B, the stage 33 for mounting thereon the wafer W is provided with a plurality of pin members 45 which protrude upward from a substrate mounting surface of the stage 33 by a predetermined distance. Therefore, the wafer W loaded into the chamber 31 is supported by the pin members 45. At that time, the amount of the deviation between the center $32a$ of the shaft 32 and the center $33a$ of the stage 33 is indicated by a width (a), and the amount of displacement between the center $33a$ of the stage 33 and the center $W_0$ of the wafer W is represented by a width (b). Accordingly, the amount of the deviation between the center $32a$ of the shaft 32 and the center $W_0$ of the wafer W may be indicated by, e.g., (a+b) (FIG. 7C).

At an initial stage where the wafer W is loaded into the chamber 31, the pin members 45 are lowered in a state where the center $W_0$ of the wafer W is deviated from the center $32a$ of the shaft 32 by the width (a+b) as can be seen from FIG. 7A. Then, the wafer W is mounted on the stage 33 (FIG. 7D).

Next, the laser beam irradiation unit 34 (see FIG. 3) disposed at the backside of the end portion of the wafer W (below the wafer in FIGS. 7A to 7F) irradiates the laser beam having an elongate shaped irradiation cross section whose longitudinal side is, e.g., about 1.2 mm and a width side is, e.g., about 0.6 mm, toward an outer peripheral portion of the wafer W while the wafer W is rotating on the stage 33 in a state where the center $W_0$ of the wafer W is deviated from the center $32a$ of the shaft 32 by the width (a+b). The power meter 35 facing the laser beam irradiation unit 34 to sandwich the wafer W receives the laser beam that is not blocked by the end portion of the wafer W among the irradiated laser beam and detects the output of the received laser beam.

The light receiving output data of the laser beam obtained by the power meter 35 and the rotation angle data of the wafer W separately obtained by the rotation angle detector are inputted to a control unit (not shown) of the beveled portion cleaning apparatus 24, and the control unit controls the pin members 45 of the stage 33 based on the input data. Specifically, the pin members 45 are raised while mounting thereon the wafer W and move on an X-Y stage by a predetermined width corresponding to the amount of the deviation so as to offset the deviation. Accordingly, the deviation of the wafer W is corrected and, then, the wafer W is centered to a normal position shown in FIGS. 7E and 7F.

In accordance with this embodiment, it is possible to detect the positional deviation of the wafer W by using the laser beam irradiation unit 34 and the power meter 35 and perform the deviation correction (centering). Thus, by accurately irradiating the cleaning laser beam onto the beveled portion of the wafer W, the polymer on the beveled portion can be reliably decomposed and removed, which leads in shortening the processing time.

In other words, unnecessary processes can be excluded compared to the case wherein the polymer on the beveled portion is removed while the wafer W is deviated. Further, the cleaning laser beam can be properly irradiated onto a minimum wafer surface required to be processed, so that the processing time and the costs can be reduced.

In this embodiment, after a positional deviation of the wafer W is detected, the positional deviation is corrected and, then, polymers on the beveled portion are cleaned by irradiating laser beam onto the wafer W that has been subjected to the positional deviation correction. However, the polymer on the beveled portion may be cleaned and removed without correcting the positional deviation of the wafer W. In such a case, the laser beam irradiation unit for irradiating a cleaning laser beam is moved by a width corresponding to the positional deviation of the wafer W in a corresponding direction thereto and then irradiates the cleaning laser beam onto the proper cleaning regions of the wafer W.

In this embodiment, there may be a case that each wafer loaded into the chamber 21 of the beveled portion cleaning apparatus 24 has its own unique deviation amount caused by, e.g., an electrostatic chuck (ESC) or the like in the processing chamber, which cannot be solved by the teaching of the transfer arm. In such a case, it is preferable to correct the deviation of each wafer independently by using a feedback control on the coordinates of the transfer arm.

In this embodiment, if a notch exists at an end portion of the wafer W, a dispersing laser light corresponding to a size of the notch can be obtained. By measuring the dispersed light with an additional laser beam receiving unit, detection of the positional deviation of the wafer W and detection of the notch formed at the beveled portion can be performed together or separately. After the detection of the notch, each wafer can be accommodated in a FOUP or the like while aligning the detected notches thereof.

In accordance with this embodiment, the amount of deviation of the wafer W is measured by directly monitoring the end portion of the wafer W as a positional deviation measurement target. Accordingly, it is possible to avoid integrating the deviation amount while performing alignment operations multiple times as in the prior art and a calibration becomes unnecessary. This can lead to scaling down of post-processing apparatus and reduction of the number of processes.

In this embodiment, the outer diameter of the wafer W and the deviation amount of the wafer W are detected simultaneously. However, after, at first, detecting and correcting the deviation amount of the wafer W, the outer diameter of the wafer W may be detected by separately irradiating the outer diameter measuring laser beam onto the end portion of the rotating wafer W.

In this embodiment, there has been described the case where the foreign substances mainly attached to the beveled portion of the wafer W are cleaned and removed. However, the present invention may be applied to the case where foreign substances (e.g., backside polymer (BSP)) are attached to the entire backside of the wafer W as well as the beveled portion of the wafer W.

In the above-described embodiments, a substrate subjected to a foreign substance removing process is not limited to a wafer for semiconductor devices. There may be various substrates for use in LCDs (Liquid Crystal Display), FPDs (Flat Panel Display) and the like, photo masks, CD substrates, printed substrates or the like.

Further, the present invention may provide a storage medium in which a program code of software that realizes the functions of the aforementioned embodiments is stored and this storage medium may be applied to a system or an apparatus whose computer (or CPU, MPU or the like) can read and execute the program code stored therein.

In this case, the program code itself read out from the storage medium realizes functions of the aforementioned embodiments and, hence, the program code and the storage medium in which the program code is stored are included in the present invention.

Moreover, the storage medium that the program code is written may be, e.g., floppy (registered trademark) disks, hard disks, magnetic-optical disks, optical disks such as CD-ROMs, CD-Rs, CD-RWs, DVD-ROMs, DVD-RAMS, DVD-RWs, DVD+RWs or the like, magnetic tapes, non-volatile memory cards, ROMs or the like. Alternatively, the program code may be downloaded via a network.

Besides, it is to be understood that the functions of the aforementioned embodiments may be accomplished not only by executing the program code read out by the computer, but also by causing an OS (operating system) or the like that operates on the computer to perform a part or all of the actual operations based on instructions of the program code.

Further, it is to be understood that the functions of the aforementioned embodiments may also be accomplished by writing the program code read out from the storage medium into a memory provided on a function expansion board inserted into the computer or in a function expansion unit connected to the computer, and then causing the CPU or the like provided on the expansion board or in the expansion unit to perform a part or all of the actual operations based on Instructions of the program code.

While the invention has been shown and described with respect to the embodiments, it will be understood by those skilled in the art that various changes and modification may be made without departing from the scope of the invention as defined in the following claims.

What is claimed is:

1. A foreign substance removing method for removing foreign substances attached to a substrate by using a foreign substance removing apparatus including a mounting table for mounting and rotating a substrate and a laser beam irradiation unit for removing foreign substances attached to a surface of the substrate by irradiating a foreign substance cleaning laser beam onto the substrate mounted and rotated on the mounting table, the foreign substance removing method comprising:

irradiating a laser beam for measuring an outer diameter of the substrate from the laser beam irradiation unit onto an end portion of the substrate mounted and rotated on the mounting table;

detecting a light receiving output of the laser beam which is not blocked by the end portion of the substrate among the irradiated laser beam, by a laser beam receiving unit;

detecting a rotation angle of the rotating substrate;

calculating an outer diameter of the substrate and an amount of a positional deviation of the substrate based on the detected light receiving output and the detected rotation angle;

moving the substrate to correct the positional deviation of the substrate based on the calculated amount of the positional deviation of the substrate;

determining a range based on the calculated outer diameter of the substrate, for decomposing substances; and decomposing and removing the foreign substances attached to the surface of the substrate located within said range from an outer end portion of the substrate by injecting a processing gas that reacts with the foreign substances and irradiating the foreign substance cleaning laser beam having an elongate shaped irradiation cross section from the laser beam irradiation unit toward the surface of the substrate within the range.

2. The foreign substance removing method of claim 1, wherein the elongate shaped irradiation cross section of the laser beam has a longitudinal side which is aligned along a scanning direction of the laser beam.

3. The foreign substance removing method of claim 1, wherein the elongate shaped irradiation cross section of the laser beam has a width side which is aligned along a scanning direction of the laser beam.

4. The foreign substance removing method of claim 1, wherein the range includes at least a beveled portion and a backside flat portion of the substrate, and irradiation conditions of the foreign substance cleaning laser beam vary corresponding to the respective portions.

5. The foreign substance removing method of claim 4, wherein the foreign substance cleaning laser beam is irradiated onto the beveled portion in a normal direction to an arc-shaped cross section of the beveled portion, and is also irradiated onto the backside flat portion in a direction perpendicular to the backside flat portion.

6. The foreign substance removing method of claim 5, wherein the beveled portion is irradiated to remove foreign substances separately from the backside flat portion and wherein a scanning speed for the foreign substance cleaning laser beam is slower during irradiation of the beveled portion than for the backside flat portion, or an output power of the foreign substance cleaning laser beam is greater during irradiation of the beveled portion than for the backside flat portion.

7. A non-transitory computer readable storage medium for storing therein a program executed by the computer which realizes a foreign substance removing method for removing foreign substances attached to a substrate by using a foreign substance removing apparatus including a mounting table for mounting and rotating a substrate and a laser beam irradiation unit for removing foreign substances attached to a surface of the substrate by irradiating a foreign substance cleaning laser beam onto the substrate mounted and rotated on the mounting table, the foreign substance removing method comprising:

irradiating a laser beam for measuring an outer diameter of the substrate from the laser beam irradiation unit onto an end portion of the substrate mounted and rotated on the mounting table;

detecting a light receiving output of the laser beam which is not blocked by the end portion of the substrate among the irradiated laser beam, by a laser beam receiving unit;

detecting a rotation angle of the rotating substrate;

calculating an outer diameter of the substrate and an amount of a positional deviation of the substrate based on the detected light receiving output and the detected rotation angle;

moving the substrate to correct the positional deviation of the substrate based on the calculated amount of the positional deviation of the substrate;

determining a range based on the calculated outer diameter of the substrate, for decomposing and removing foreign substances; and decomposing and removing the foreign substances attached to the surface of the substrate located within said range from an outer end portion of the substrate by injecting a processing gas that reacts with the foreign substances and irradiating the foreign substance cleaning laser beam having an elongate shaped irradiation cross section from the laser beam irradiation unit toward the surface of the substrate within the range.

8. The foreign substance removing method of claim 1, wherein the mounting table is provided with pin members and the moving of the substrate to correct the positional deviation of the substrate includes raising the substrate by the pin members and offsetting the deviation by moving the pin members based on the calculated amount of the positional deviation.

9. The non-transitory computer readable storage medium of claim 7, wherein the mounting table is provided with pin members and the moving of the substrate to correct the positional deviation of the substrate includes raising the substrate by the pin members and offsetting the deviation by moving the pin members based on the calculated amount of the positional deviation.

10. The method of claim 1, further including separately irradiating a beveled portion of the substrate and a backside flat portion of the substrate to remove foreign substances, and wherein a scanning speed during irradiation of the beveled portion is slower than a scanning speed during irradiation of the backside flat portion.

11. The method of claim 1, further including separately irradiating a beveled portion of the substrate and a backside flat portion of the substrate to remove foreign substances, and wherein an output power of the foreign substance cleaning laser beam is greater during irradiation of the beveled portion than for the backside flat portion.

* * * * *